United States Patent
Facey et al.

(10) Patent No.: US 7,891,537 B2
(45) Date of Patent: Feb. 22, 2011

(54) SPUTTER TARGET AND BACKING PLATE ASSEMBLY

(75) Inventors: Joseph C. Facey, Monsey, NY (US); Ivan Ward, Nanuet, NY (US)

(73) Assignee: Praxair S. T. Technology, Inc., North Haven, CT (US)

( * ) Notice: Subject to any disclaimer, the term of this patent is extended or adjusted under 35 U.S.C. 154(b) by 0 days.

(21) Appl. No.: 12/754,965

(22) Filed: Apr. 6, 2010

(65) Prior Publication Data

US 2010/0187098 A1   Jul. 29, 2010

Related U.S. Application Data

(62) Division of application No. 10/670,460, filed on Sep. 26, 2003, now Pat. No. 7,431,195.

(51) Int. Cl.
*B23K 31/02* (2006.01)
*C25B 11/02* (2006.01)

(52) U.S. Cl. .................. 228/164; 228/245; 204/298.12; 204/298.13

(58) Field of Classification Search ........................ None
See application file for complete search history.

(56) References Cited

U.S. PATENT DOCUMENTS

| | | | |
|---|---|---|---|
| 5,009,765 A | 4/1991 | Qamar et al. | |
| 5,143,590 A | 9/1992 | Strothers et al. | |
| 5,230,459 A | 7/1993 | Mueller et al. | |
| 5,230,462 A | 7/1993 | Vascak et al. | |
| 5,282,943 A * | 2/1994 | Lannutti et al. | 204/192.12 |
| 5,529,673 A | 6/1996 | Strauss et al. | |
| 5,593,082 A | 1/1997 | Ivanov et al. | |
| 5,687,600 A | 11/1997 | Emigh et al. | |
| 5,836,506 A | 11/1998 | Hunt et al. | |
| 6,071,389 A * | 6/2000 | Zhang | 204/298.12 |
| 6,073,830 A | 6/2000 | Hunt et al. | |
| 6,164,519 A * | 12/2000 | Gilman et al. | 228/107 |
| 6,579,431 B1 * | 6/2003 | Bolcavage et al. | 204/298.13 |
| 6,599,405 B2 | 7/2003 | Hunt et al. | |
| 6,638,402 B2 | 10/2003 | Marx et al. | |
| 6,725,522 B1 | 4/2004 | Ivanov et al. | |
| 6,749,103 B1 | 6/2004 | Ivanov et al. | |
| 6,872,284 B2 | 3/2005 | Ivanov et al. | |
| 6,998,033 B2 | 2/2006 | Lawson et al. | |
| 7,041,201 B2 | 5/2006 | Gung et al. | |
| 7,114,643 B2 | 10/2006 | Ivanov et al. | |
| 7,146,703 B2 | 12/2006 | Ivanov | |
| 2004/0079634 A1 * | 4/2004 | Wickersham et al. | 204/298.12 |

(Continued)

FOREIGN PATENT DOCUMENTS

JP    63-317668 A  * 12/1988

(Continued)

OTHER PUBLICATIONS

Machine translation of JP-11-200028A.*

*Primary Examiner*—Kiley Stoner
(74) *Attorney, Agent, or Firm*—Iurie A. Schwartz

(57) ABSTRACT

A method for aligning the sputter target onto a backing plate having a peripheral arcuate-shaped flange on its bonding surface to provide an aligned and uniform solder bonded interface; and the sputter target/backing plate assembly so produced.

7 Claims, 2 Drawing Sheets

U.S. PATENT DOCUMENTS

| | | |
|---|---|---|
| 2004/0194942 A1 | 10/2004 | Okamoto et al. |
| 2004/0256226 A1 | 12/2004 | Wickersham, Jr. |
| 2005/0011749 A1* | 1/2005 | Kachalov et al. ....... 204/192.12 |
| 2005/0061857 A1 | 3/2005 | Hunt et al. |
| 2005/0161322 A1 | 7/2005 | Smathers |
| 2005/0284746 A1 | 12/2005 | Ivanov |
| 2006/0065517 A1 | 3/2006 | Ivanov et al. |
| 2006/0272802 A1 | 12/2006 | Sakayori et al. |

FOREIGN PATENT DOCUMENTS

| | | | |
|---|---|---|---|
| JP | 8-170170 A | * | 7/1996 |
| JP | 11-200028 A | * | 7/1999 |
| WO | WO 2005/007924 A1 | | 1/2005 |

* cited by examiner

SPUTTER TARGET AND BACKING PLATE ASSEMBLY

The present application is a division of U.S. patent application Ser. No. 10/670,460, filed Sep. 26, 2003, now U.S. Pat. No. 7,431,195 issued Oct. 7, 2008 and entitled "METHOD FOR CENTERING A SPUTTER TARGET ONTO A BACKING PLATE AND THE ASSEMBLY THEREOF", which is incorporated by reference herein in its entirety.

FIELD OF THE INVENTION

The invention relates to a method of bonding a sputter target to a backing plate, and more specifically, the use of a backing plate having at least two spaced-apart peripheral flange segments on the bonding surface of the backing plate so that the flange segments provide a centering for the sputter target and also provide a uniform spacing between the target and backing plate to accommodate a uniform solder bonded interface.

BACKGROUND OF THE INVENTION

Cathodic sputtering is widely used for the deposition of thin layers of material onto desired substrates. Basically, this process requires a gas ion bombardment of a target having a face formed of a desired material that is to be deposited as a thin film or layer on a substrate. Ion bombardment of the target not only causes atoms or molecules of the target materials to be sputtered, but imparts considerable thermal energy to the target. This heat is dissipated beneath or around a backing plate that is positioned in a heat exchange relationship with the target. The target forms a part of a cathode assembly that, together with an anode, is placed in an evacuated chamber filled with an inert gas, preferably argon. A high voltage electrical field is applied across the cathode and the anode. The inert gas is ionized by collision with electrons ejected from the cathode. Positively charged gas ions are attracted to the cathode and, upon impingement with the target surface, these ions dislodge the target material. The dislodged target material traverses the evacuated enclosure and deposits as a thin film on the desired substrate, which is normally located close to the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent to the target surface, thereby increasing the number of electron-gas atom collisions in the area to produce an increase in the number of positive gas ions in the regions that strike the target to dislodge the target material. Accordingly, the target material becomes eroded in a generally annular section of the target face, known as the target raceway.

In a conventional target cathode assembly, the target is attached at a single bonding surface to a nonmagnetic backing plate to form a parallel interface in the assembly. The backing plate is used to provide a means for holding the target assembly in the sputtering chamber and to provide structural stability to the target assembly. Also, the backing plate is normally water-cooled to carry away the heat generated by the ion bombardment of the target. Magnets are typically arranged beneath the backing plate in well-defined positions to form the above-noted magnetic field in the form of a loop or tunnel extending around the exposed face of the target.

To achieve good thermal and electrical contact between the target and the backing plate, these members are commonly attached to each other by use of soldering, brazing, diffusion bonding, mechanical fastening or epoxy bonding.

Smooth surface diffusion bonding is an applicable method of bonding, but has only limited use in the bonding of sputtering target components. The bond is produced by pressing the material surfaces into intimate contact while applying heat, to induce metallurgical joining and diffusion to a varying extent across the bond interface. Bonding aids, metal combinations which are more readily joined, are sometimes applied to one or both of the surfaces to be bonded. Such coatings may be applied by electroplating, electroless plating, sputtering, vapor deposition or other usable techniques for depositing an adherent metallic film. It is also possible to incorporate a metallic foil between bonding members that has the ability to be more easily bonded to either of the materials to be joined. The surfaces to be joined are prepared by chemical or other means to remove oxides or their chemical films which interfere with bonding.

Smooth surface diffusion bonding requires extreme care in preparation and in maintaining surface cleanliness prior to and during the bonding operation to ensure reliable bond qualities. Because the diffusion bond interfaces are planar, they are subject to stressing in simple shear which commonly leads to peeling away at the ends of the bond area. The formation of brittle intermetallics at the bond interface, which increase in thickness with the associated long times of heat exposure, add to the potential of bond shear failure. An additional technique for bonding, as described in U.S. Pat. No. 5,230,459 includes the pre-bonding step of providing machined grooves in the surface of one of the components to be solid-state bonded. This feature causes disruption of the bond surface of the associated component during heated pressure application. The material having the greater strength of hardness will normally be provided with the grooves such that, during bonding, it will penetrate into the softer member with the softer metal substantially filling the grooves.

Groove bonding is applicable to bonding many dissimilar materials, but is limited to materials that have dissimilar melting temperatures because the process must occur near the melting temperature of the lower melting point alloy. This precludes the use of this technique for similar metals. It is also possible that the saw tooth nature of the grooves may act as a stress concentrator and promote premature cracking in the alloys near the bonds. Furthermore, machining of the grooves is a time consuming operation.

In U.S. Pat. No. 5,836,506, hereby incorporated by reference in its entirety, a method is disclosed for performing a surface roughening treatment to the bonding surface of the sputter target and/or backing plate, followed by solid state bonding. This roughening surface treatment provides 100% surface bonding compared to only 99% surface bonding in the absence of the surface treatment. The treatment further provides a bond with over twice the tensile strength of a bond formed from the non-treated smooth surfaces.

In all of the above diffusion bonding processes, elevated temperatures of varying degree are applied to form the bond between the target and the backing plate. Thus, in each of these processes, changes in the microstructures of the target and backing plate materials are likely to occur because prolonged exposure of metals to elevated temperatures causes grain growth. Great strides have been made in this art to process sputter target blanks to achieve certain microstructures that are linked to increased sputtering efficiency and improved thin film quality. After a desired microstructure is obtained in the sputter target, the microstructures could be in jeopardy of being altered by elevated temperature bonding methods for attaching the target to the backing plate.

Additionally, although diffusion bonding has been proven successful, extra large target/backing plate assemblies require large scale diffusion bonding presses and this poses a significant capital expenditure.

Prior art attempts to solve the problem of distorting the microstructure of the sputter target and maintaining a consistent and uniform bond, requires the placing of wire gauges between the sputter target and backing plate. This method is labor intensive, costly and the wire spacer gauges tend to move during the bonding process. Additionally, when the wire gauges are used on the outer edges of the sputter target assembly, bowing of thin or large targets can occur due to an inconsistent thickness of sputter target material. Thickness uniformity of sputter targets is particularly important for ferromagnetic materials in order to achieve good thickness and sheet resistance uniformity of sputtered films.

It is an object of the invention to provide a method of forming a bonded sputter target/backing plate assembly that has a uniform thickness bond interface and uniform flatness of the target sputtering surface.

Another object of the invention is to provide a bonded sputter target/backing plate assembly that does not compromise the microstructural characteristics of the sputter target.

Another object of the invention is to provide a bonded sputter target/backing plate assembly having at least two spaced-apart peripheral flange segments disposed on the bonding surface of the backing plate and at least two peripheral notch segments to accommodate the at least two peripheral flange segments on the backing plates.

SUMMARY OF THE INVENTION

In one embodiment of the invention, there is provided a method for forming a solder bonded sputter target/backing plate assembly comprising the steps of:

a) forming a backing plate with a bonding surface having at least two spaced-apart peripheral flange segments disposed on the bonding surface of the backing plate;

b) forming a sputter target having a sputter surface and at least two peripheral notched segments on the bonding surface and said notched segments adapted for aligning with the flange segments;

c) applying a solder material to the interface spacing defined by superimposing and aligning said sputter target on the backing plate and said flange segments having a height larger than the depth of the notched segments; and d) allowing said solder material to solidify and bond the sputter target to the backing plate.

Another embodiment of this invention there is provided a method for forming a solder bonded sputter target/backing plate assembly comprising the steps of:

a) forming a backing plate with a bonding surface having at least two spaced-apart peripheral flange segments and a spacer element disposed on the inner walls of the flange segments and the peripheral edge surface of the backing plate, and said spacer elements having a height equivalent to the height of the intended solder bonded interface;

b) forming a sputter target having a sputter surface and a bonding surface and having a size to accommodate the spaced-apart flange segments;

c) applying a solder material to the interface spacing defined by superimposing and aligning said sputter target between the flange segments and onto the spacer elements;

d) allowing said solder material to solidify and bond the sputter target to the backing plate; and e) removing said flange segments from the backing plate.

DESCRIPTION OF THE PREFERRED EMBODIMENT

In the preferred embodiment of the invention, the solder bonded sputter target/backing plate assembly would be disc-shaped and have at least two arcuate-shaped flanges spaced apart on the maximum degree separation of the bonded surface of the disc-shaped backing plate. Preferably, the backing plate and flange segments are made of the same material and the height of the flange segments should be constant so that a uniform thickness solder bonded interface can be achieved along with providing a centering means for the sputter target. For most applications, the height of the flange segments could vary between about 0.100 inch and about 0.500 inch, preferably between about 0.100 inch and about 0.300 inch and most preferably about 0.200 inch. Preferably, the thickness of the flange is between about 0.200 inch and about 0.300 inch.

The spacing of the flange segments has to be sufficient to permit centering of the sputter target, especially for thinner and large diameter sputter targets. Preferably, the flange segments form a single arcuate-shaped flange, i.e., ring, and have a uniform height as discussed above. In the preferred embodiment, the notch segments form a single arcuate-shaped peripheral notch and could have a depth smaller than the height of the arcuate-shaped flange of a mating backing plate. Preferably the depth of the arcuate-shaped notch should be between about 5% and about 20% of the height of the flange, more preferably between about 10% and about 15%. This difference between the notch's depth and the flange's height is the thickness of the solder bonded interface of the sputter target and the backing plate. Consequently the thickness of the solder bonded interface will vary depending on the size of the sputter target used. The thickness of the width of the flange segments could vary, depending on the application, and preferably be between about 0.100 inch and about 9.500 inch, more preferably between about 0.100 inch and about 0.400 inch and most preferably about 0.250 inch. Again, the width of the notch can be between 10% and about 50% of the width of the flange, preferably between about 20% and about 40% and most preferably between about 20% and about 30%.

In the embodiment using a spacer element, the dimensions of the flange segments would be as discussed above and the spacer element could preferably be an annular ring-shaped having a height of between about 0.010 and about 0.030 inch, and preferably between about 0.015 and about 0.025 inch. This height dimension is the thickness of the solder bonded interface of the sputter target and backing plate. Preferably the radial width of the spacer element could be between about 0.010 inch and about 0.050 inch, more preferably between about 0.015 inch and about 0.030 inch and most preferably about 0.020 inch. The flange could be a removable flange so that the backing plate could be reused for other applications.

The metals used for the sputter target and backing plate may be any of a number of different metals, either in pure or alloy form. For example, the sputter target may be made of titanium, aluminum, copper, molybdenum, cobalt, chromium, ruthenium, rhodium, palladium, silver, osmium, iridium, platinum, gold, tungsten, silicon, tantalum, vanadium, nickel, iron, manganese, germanium, or alloys thereof. The backing plate could be made of copper, aluminum, titanium, or alloys thereof. Preferred sputter target/backing plate metal pairings include a titanium target bonded to an aluminum backing plate; a titanium target bonded to a copper backing plate; a titanium target bonded to a titanium backing plate; a molybdenum target bonded to a copper backing plate; a cobalt target bonded to a copper backing plate; a chromium target bonded to copper backing plate; and a target formed of a precious metal such as ruthenium, rhodium, palladium, silver, osmium, iridium, platinum or gold, bonded to a copper backing plate. If a titanium-tungsten alloy is used, the alloy preferably includes about 10% to 15% titanium by weight.

Although the method has been described in conjunction with a disc-shaped sputter target/backing plate assembly, it will be readily apparent to one of ordinary skill that the method may be used to bond sputter targets and backing plates having any of a number of different shapes and sizes.

On large size sputter targets, the flange segment may not be sufficient to prevent bowing or other distortion of the sputter target and thus at least one protruding ridge can be disposed within the flange and centered to provide a support for the sputter target. The height of the protruding ridge is preferably the height of the flange. The shape of the protruding ridges could be arcuate, circle, square, rectangular, polygon and a combination thereof.

Suitable solder materials would be liquid or paste solders comprising a low melting metal containing component or a mechanically alloyed solid solution component. Examples of suitable solder materials are tin-lead, indium-tin, tin-silver, tin-copper, or tin-silver-copper. Preferably, the flange segments could provide at about one opening so that the solder could flow easily between the sputter target and backing plate.

DETAILED DESCRIPTION OF THE DRAWINGS

Figure 1:
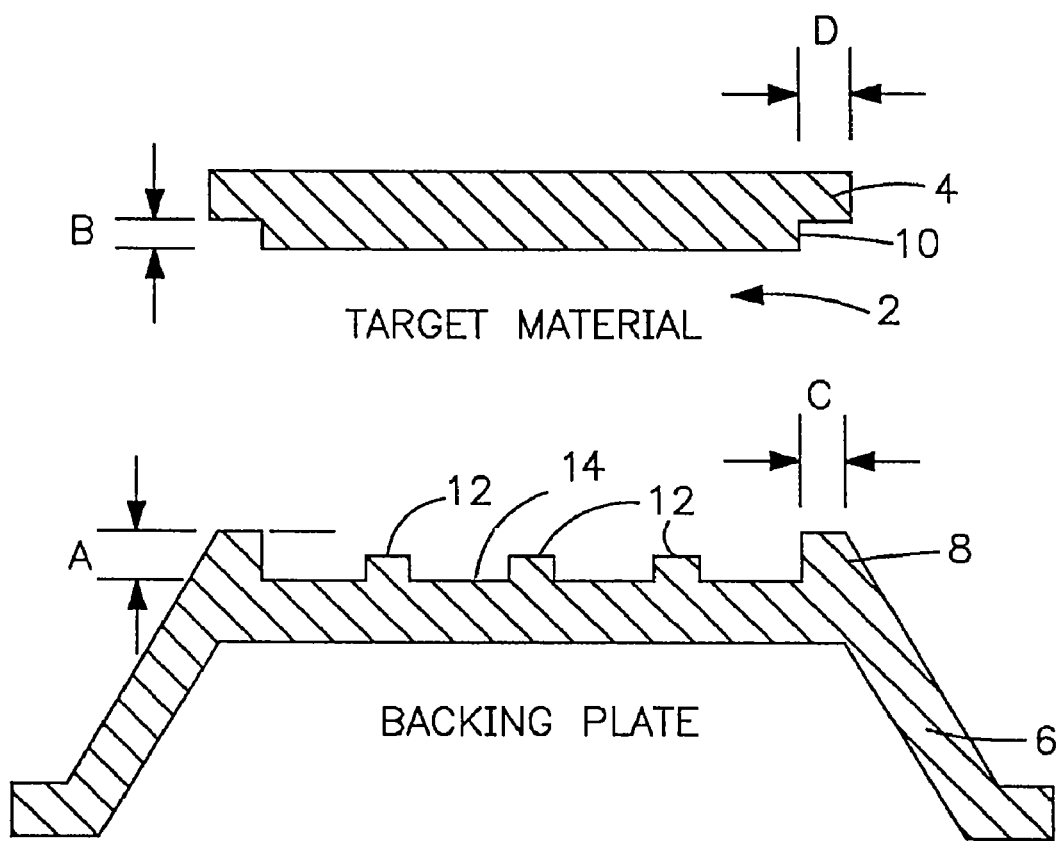
FIG. 1 is a cross and sectional view of a sputter target/backing plate assembly showing the sputter target separate from the backing plate.

Referring to FIG. 1, a sputter target/backing plate assembly 2 is shown having a sputter target 4 and a backing plate 6. The backing plate 6 is made with arcuate-shaped flange 8 to provide a centering means to center the sputter target 4 upon the backing plate 6.

The height A of flange 8 is larger than the depth B of the notch 10 as discussed below. When the sputter target 4 is superimposed on the backing plate 6 via flange 8 there is an interface spacing of A-B. This spacing (not shown) is used to accommodate a solder material to secure the sputter target 4 to the backing plate 6. Although not shown, the flange could have two segments spaced 180° apart, three segments spaced 120° apart, four segments spaced 90° apart, etc. When using more than one flange arrangement, a spacing is available to permit a solder material to flow into the spacing (A-B) formed at the interface of the sputter target 4 at the backing plate 6. As shown in FIG. 1, the width thickness C of the backing plate 6 is the same as the radial edge D of the sputter target 4. Solder will flow in the space A-B and also in the interface of B-D and A-C to provide a stronger bond between the sputter target 4 and the backing plate 6. In some applications, such s large sputter targets, one or more protruding ridges 12 could be disposed on the bonding surface 14 to provide support to the sputter target 4.

Figure 2:
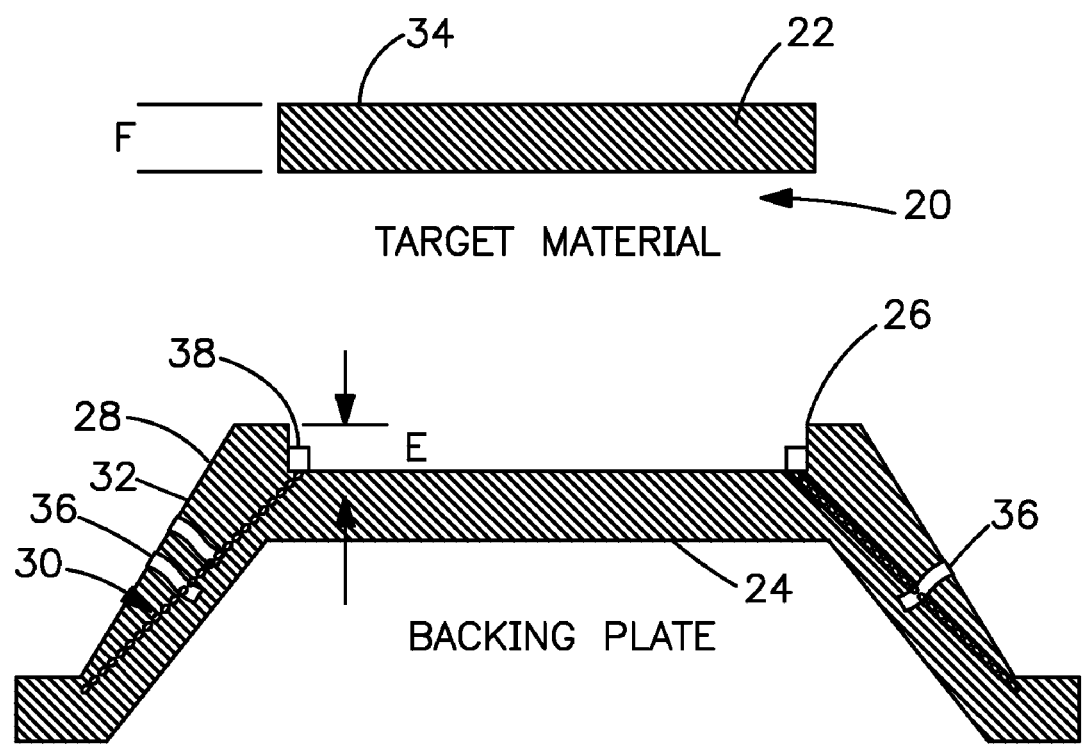
FIG. 2 is a cross-sectional view of another sputter target/backing plate assembly showing the sputter target separate from the backing plate.

FIG. 2 shows a sputter target/backing plate assembly 20 having a disc-shaped sputter target 22 and a disc-shaped backing plate 24. The backing plate 24 has a peripheral flange 26 to provide a centering means to center sputter target 22 onto the backing plate 24. Preferably height E is smaller than height F so that weight or pressure may be applied to target face (34).

The slanted flange leg 28 is shown with a dotted line 30 indicating where the area 32 can be removed by any conventional means. The removal of area 32 will provide the sputter target with an unobstructed sputtering surface 34. In another embodiment of this assembly 20, the area 32 defined by line 30 would be secured to the backing plate 24 with a removable means, such as screw 36. This would permit the backing plate to be reused for multiple applications. Spacer 38, such as an annular ring, could be used to provide an interface space between the sputter target 22 and backing plate 24 to accommodate a solder material (not shown). The height of the spacer 38 will be the thickness of the solder bonded interface upon assembly of the sputter target and backing plate.

The method of this invention is especially useful for solder bonding 30 mm magnetic alloy sputter targets as the nature of the material requires the thinner target configuration, with a greater sputter diameter, and therefore increasingly difficult to obtain a uniform bond layer thickness.

Advantages of this invention are consistent centering of the sputter target upon the backing plate, consistent solder bonded layer thickness, reduction in preparation time, uniform flatness of the sputter target surface, and the ability to provide larger sputter target diameters with a uniform thickness solder bonded interface.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative assembly and method shown and described. Accordingly, departures may be made from such details without departing from the scope or spirit of applicants' general inventive concept.

The invention claimed is:

1. A method for forming a solder bonded sputter target/backing plate assembly comprising the steps of:
   a) forming a backing plate with a bonding surface having at least two spaced-apart peripheral flange segments and a spacer element disposed on the inner walls of the flange segments and the peripheral edge of the bonding surface of the backing plate; said spacer elements having a height equivalent to the thickness of the height of the intended solder bond;
   b) forming a sputter target having a sputter surface and a bonding surface and having a size to accommodate the spaced apart flange segments;
   c) applying a solder material to the interface spacing defined by superimposing and aligning said sputter target between the flange segments onto the spacer element;
   d) allowing said solder material to solidify and bond the sputter target to the backing plate; and
   e) removing said flange segments from the backing plate.

2. The method of claim 1 wherein the backing plate and sputter target are disc-shaped.

3. The method of claim 1 wherein the flange segments are removed.

4. The method of claim 1 wherein the height of the flange is between about 0.100 inch and 0.500 inch, and the thickness of the width of the flange is between about 0.100 inch and about 0.500 inch.

5. The method of claim 1 wherein the sputter target is selected from the group comprising titanium, aluminum, copper, molybdenum, cobalt, chromium, ruthenium, rhodium, palladium, silver, osmium, iridium, platinum, gold, tungsten, silicon, tantalum, vanadium, nickel, iron, manganese, germanium, and alloys thereof and the backing plate is selected from the group comprising copper, aluminum, titanium, and alloys thereof.

6. A solder bonded sputter target/backing plate assembly comprising: a backing plate with a bonding surface having at least two of spaced-apart removable peripheral flanges and a spacer element disposed on the bonding surface of said backing plate proximate to the removable peripheral flanges; a sputter target having a sputtering surface and a bonding surface wherein said bonding surface of the sputter target is aligned with the bonding surface of the backing plate and in contact with the spacer element; and a solder bonded layer disposed between the bonding surface of the sputter target and the bonding surface of the backing plate producing an effective uniform thickness solder bonded interface; wherein the removable peripheral flanges form a single arcuate-shaped flange and the sputter target is disc-shaped adapted to fit within the single arcuate-shaped flange.

7. The solder bonded sputter target/backing plate assembly of claim 6 wherein the sputter target is selected from the group consisting of titanium, aluminum, copper, molybdenum, cobalt, chromium, ruthenium, rhodium, palladium, silver, osmium, iridium, platinum, gold, tungsten, silicon, tantalum, vanadium, nickel, iron, manganese, germanium, or alloys thereof and the backing plate is selected from the group consisting of copper, aluminum, titanium, and alloys thereof, and the bonded solder is selected from the group consisting of tin-lead, indium-tin, tin-silver, tin-copper, or tin-silver-copper.

* * * * *